United States Patent [19]

Bismarck

[11] Patent Number: 4,707,623
[45] Date of Patent: Nov. 17, 1987

[54] CMOS INPUT LEVEL SHIFTING BUFFER CIRCUIT

[75] Inventor: Otto H. Bismarck, Woodbridge Township, Middlesex County, N.J.

[73] Assignee: RCA Corporation, Somerville, N.J.

[21] Appl. No.: 890,275

[22] Filed: Jul. 29, 1986

[51] Int. Cl.⁴ .................. H03K 19/092; H03K 17/16; H03K 19/20
[52] U.S. Cl. .................................. 307/475; 307/443; 307/451; 307/469; 307/264; 307/585
[58] Field of Search ............... 307/443, 468, 469, 475, 307/264, 585, 451

[56] References Cited

U.S. PATENT DOCUMENTS 4,064,405  12/1977  Cricchi et al. ............... 307/451
4,574,273  3/1986  Atsumi et al. ............... 307/443

Primary Examiner—John S. Heyman
Assistant Examiner—M. R. Wambach
Attorney, Agent, or Firm—Stanley C. Corwin; Birgit E. Morris; Henry I. Schanzer

[57] ABSTRACT

A binary input signal, $V_{IN}$, having a minimum high level value, $V_{INHMIN}$, is directly applied to the gate electrode of a pull-up transistor whose conduction path is connected between a first power terminal and an output terminal. $V_{IN}$ is also applied via level shift circuitry to the gate electrode of a pull-down transistor whose conduction path is connected between the output terminal and a second power terminal. $V_{IN}$ is level shifted in the positive direction by a preselected voltage level whereby the pull-down transistor is turned-on even when its threshold voltage is approximately equal to $V_{INHMIN}$.

9 Claims, 5 Drawing Figures

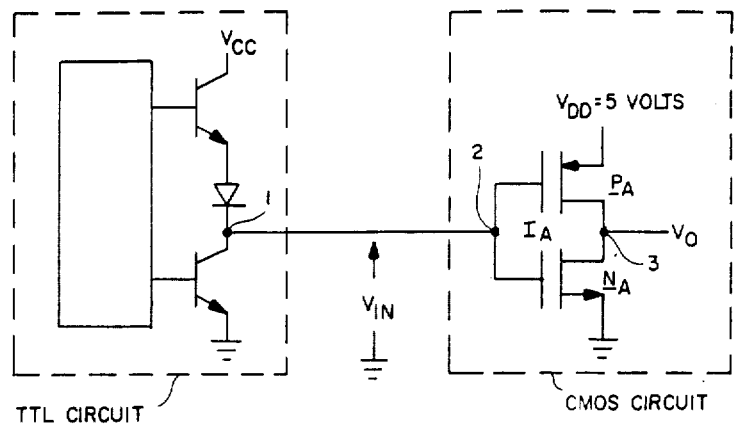
FIG. IA PRIOR ART
FIG. IB PRIOR ART
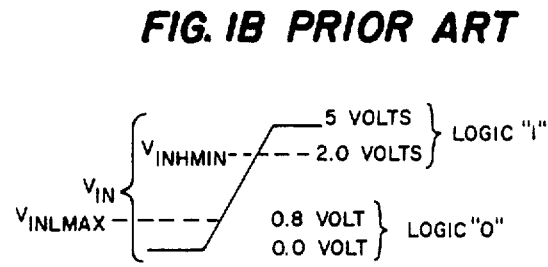

CMOS INPUT LEVEL SHIFTING BUFFER CIRCUIT

This invention relates to an input buffer circuit operable as a level shift circuit.

It is often necessary and/or desirable to operate different parts of an electronic system at different voltage levels. At the places where the different parts interface, they must be coupled to each other. However, the signals and parts at the interfaces are not necessarily compatible. It is, therefore, necessary to provide input buffer and level shift circuits which can render one part of the system compatible with the other.

An example of a problem which exists in interfacing the output signal of a transistor transistor logic (TTL) circuit to the input of a complementary metal oxide semiconductor (CMOS) circuit is best illustrated by reference to the prior art circuit shown in FIG. 1A and to the accompanying waveform shown in FIG. 1B. Normally, as shown in FIG. 1A, output 1 of a TTL circuit, at which is produced a signal $V_{IN}$, is connected to input 2 of a CMOS circuit. The CMOS circuit includes an insulated-gate field-effect transistor (IGFET), $P_A$, of P-conductivity type and an IGFET, $N_A$, of N-conductivity type. The gates of $P_A$ and $N_A$ are connected to input node 2, with the source of $P_A$ being connected to a power terminal to which is applied a relatively positive potential of $V_{DD}$ volts and with the source of $N_A$ being returned to ground potential. The drains of $P_A$ and $N_A$ are connected to an output terminal 3, whereby $P_A$ and $N_A$ are interconnected to function as a complementary inverter, $I_A$.

Note that a typical TTL output ranges from a maximum "low" level ($V_{INLMAX}$) of 0.4 volt to a minimum "high" level ($V_{INHMIN}$) of 2.4 volts. However, if allowance is made for degradation due to noise, $V_{INLMAX}$ may equal 0.8 volt and $V_{INHMIN}$ may equal 2.0 volt. Thus, as shown in FIG. 1B, the output signal of the TTL circuit, denoted as $V_{IN}$, has a logic "1" or "high" level which ranges from approximately 2.0 volts to 5 volts, and a logic "0" or "low" level which ranges from 0 volts to 0.8 volt. The minimum high value of $V_{IN}$ (e.g., 2.0 volts) is denoted herein as $V_{INHMIN}$ and the maximum low value of $V_{IN}$ (e.g. 0.8 volt) is denoted as $V_{INLMAX}$.

The desired response of the complementary inverter, $I_A$, to the TTL signal $V_{IN}$ is as follows. When $V_{IN}$ is "low", (i.e., 0.8 volt or less) the P-channel IGFET, $P_A$, is to be turned-on harder than the N-channel IGFET, $N_A$, whereby the output voltage (Vo) of the CMOS circuit should be more positive than $V_{DD}/2$ volts and be preferably at, or close to, $V_{DD}$ volts. When $V_{IN}$ is "high", (2.0 volts or more) $N_A$ is to be turned-on much harder than $P_A$ whereby the output voltage (Vo) at output terminal 3 should be less than $V_{DD}/2$ volts and be preferably at, or close to, ground potential.

However, a problem exists where, for example, the threshold voltage ($V_{TN}$) of the N-channel IGFET, $N_A$ is equal to 2.0 volts, and the minimum high input level ($V_{INHMIN}$) is also equal to 2.0 volts. When $V_{IN}$ is equal to $V_{INHMIN}$ which is equal to the $V_{TN}$ of the N-channel IGFET, $N_A$, the latter does not turn-on (i.e. it is or remains turned-off) while $P_A$ is turned-on. The output (Vo) of the CMOS circuit then remains significantly more positive than $V_{DD}/2$ volts, although $V_{IN}$ is "high" and Vo should be less positive than $V_{DD}/2$ volts. Evidently, the $V_{INHMIN}$ input signal condition applied to complementary inverter $I_A$ is then not recognized and/or sensed by the CMOS circuit.

The problem of recognizing the minimum high level ($V_{INHMIN}$) of an input signal when the threshold voltage level ($V_T$) of the transistor intended to sense and respond to that level is equal to, or greater than, $V_{INHMIN}$ is resolved, in circuits embodying the invention, by level shifting the input signal by an amount which ensures the turn-on of the transistor designed to sense and respond to the "high" level condition even when the input signal is equal to $V_{INHMIN}$.

Accordingly, in a particular embodiment of the invention, a binary input signal, $V_{IN}$, having a minimum high level value, $V_{INHMIN}$, is directly applied to the gate electrode of a pull-up transistor whose conduction path is connected between a first power terminal and an output terminal. $V_{IN}$ is also applied via level shift circuitry to the gate electrode of a pull-down transistor whose conduction path is connected between the output terminal and a second power terminal. $V_{IN}$ is level shifted in the positive direction by a preselected voltage level whereby the pull-down transistor is turned-on even when its threshold voltage is approximately equal to $V_{INHMIN}$.

The invention is best understood by reference to the accompanying drawing in which like reference characters denote like components and in which;

FIG. 1A is a schematic diagram of a prior art circuit;

FIG. 1B is a diagram of a typical output signal produced by a transistor-transistor-logic (TTL) circuit;

Figure 2:
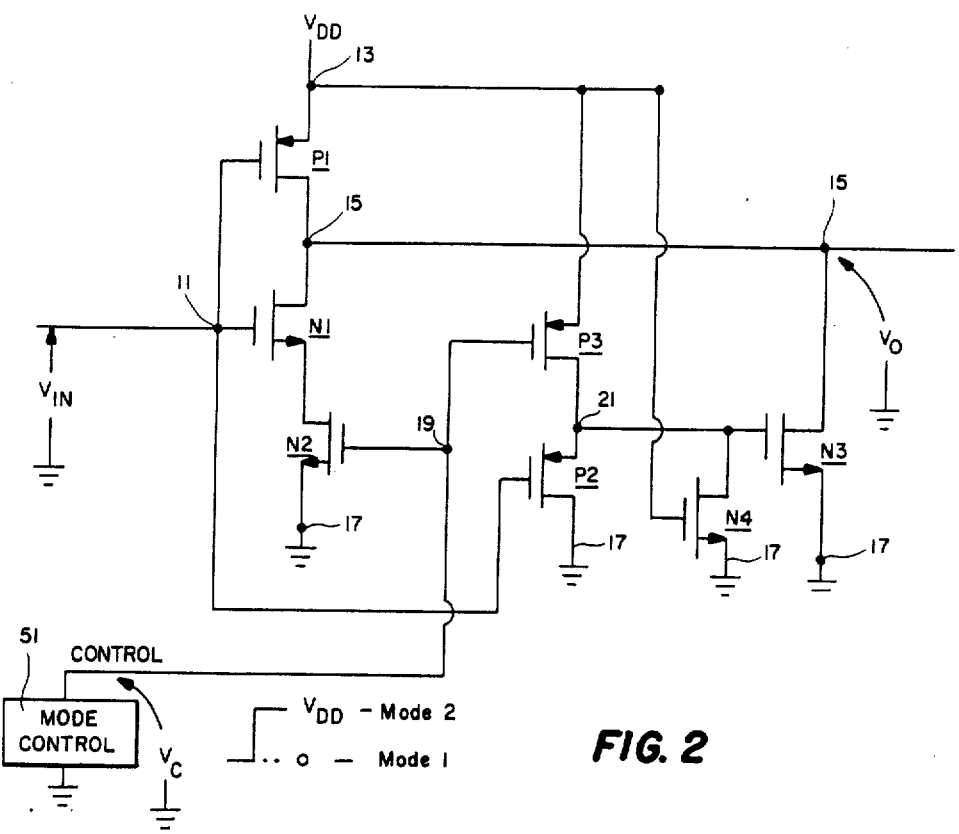
FIG. 2 is a schematic diagram of a dual mode circuit embodying the invention.

In the discussion to follow, insulated-gate field-effect transistors (IGFETs) of P-conductivity type, are identified by the letter "P" followed by a reference numeral and the IGFETs of N conductivity type are identified by the letter "N" followed by a reference numeral.

The dual mode circuit of FIG. 2 includes an input terminal 11 to which is applied an input signal, $V_{IN}$, which, as shown in FIG. 1B, may vary from a logic "low" ranging between zero volt and 0.8 volt and a logic "high" ranging between 2 volts and 5 volts. The gate electrodes of IGFETs P1 and N1 are connected to terminal 11 and the gate electrode of a source-follower level-shifting IGFET P2 is also connected to terminal 11. The source electrode of transistor P1 is connected to power terminal 13 to which is applied a potential of $V_{DD}$ volts; where $V_{DD}$ is positive with respect to ground and $V_{DD}$ may range from a low of 4.5 volts to more than 5 volts. The drain electrodes of IGFETs P1 and N1 are connected to a terminal 15 which functions as the output terminal of the circuit. The source electrode of IGFET N1 is connected to the drain electrode of an IGFET N2 whose source electrode is connected to terminal 17 to which is applied ground potential. The gate electrode of "switching" IGFET N2 and the gate electrode of a "load" IGFET P3 are connected to a control terminal 19. The drain of IGFET P3 and the source of IGFET P2 are connected in common to a node 21 to which is connected the gate of an IGFET N3 and the drain of a "load" IGFET N4. The source of P3 is connected to terminal 13 while the drain of P2 and the source electrodes of IGFETs N3 is connected to terminal 15 and the gate electrode of transistor N4 is returned to power terminal 13.

To better understand the discussion to follow, the relative ON impedance ($Z_{ON}$) of some of the IGFETs of FIG. 2, for like bias conditions, may be assumed to be as follows:

(a) the $Z_{ON}$ of P3 is approximately equal to 10 K ohms;
(b) the $Z_{ON}$ of N4 is equal to 100 K ohms;
(c) the $Z_{ON}$ of N2 is equal to 1 K ohm;
(d) and the $Z_{ON}$ of N1, P1, P2, N3 is equal to 2 K ohms.

A control signal (Vc) from a mode control source 51 is applied to terminal 19 to control the operative mode of the circuit of FIG. 2.

In one mode (i.e. mode 2) Vc is "high" (i.e. at, or close to, $V_{DD}$ volts), causing transistor N2 to be turned-on hard and transistor P3 to be turned-off. Transistor N2 is a relatively low impedance, high conductivity, device. Therefore, when transistor N2 is turned-on, the source electrode of N1 is returned to ground potential via a low impedance. Concurrently, the turn-off of P3 breaks any connection between power terminal 13 and node 21 to which the gate of N3 is connected. Transistor N4, which is turned-on, functions as a high impedance ground return connected between the gate of N3 and ground. N4 may be made a very high impedance since its function is to provide a conduction path to ground for any leakage current flowing into node 21 via the source-drain path of P3, or any other source. With P3 turned-off, N4, which is turned-on, functions to keep the gate of N3 at, or close to, ground potential. Thus, the turn-off of P3 and the turn-on of N4 ensures that N3 is turned-OFF.

Consequently, when Vc is high, the circuit of FIG. 2 consists essentially of "pull-up" transistor P1 whose source-to-drain path is connected between power terminal 13 and output node 15 and "pull-down" transistor N1 whose source-to-drain path is connected via the source-to-drain path of N2 between output node 15 and ground. N3 and P3 are turned-OFF and P2 does not affect the circuit operation. The circuit of FIG. 2 then functions essentially as a standard complementary inverter such as $I_4$ in FIG. 1A. The operation of the circuit so configured is well known and need not be further detailed.

Figure 3:
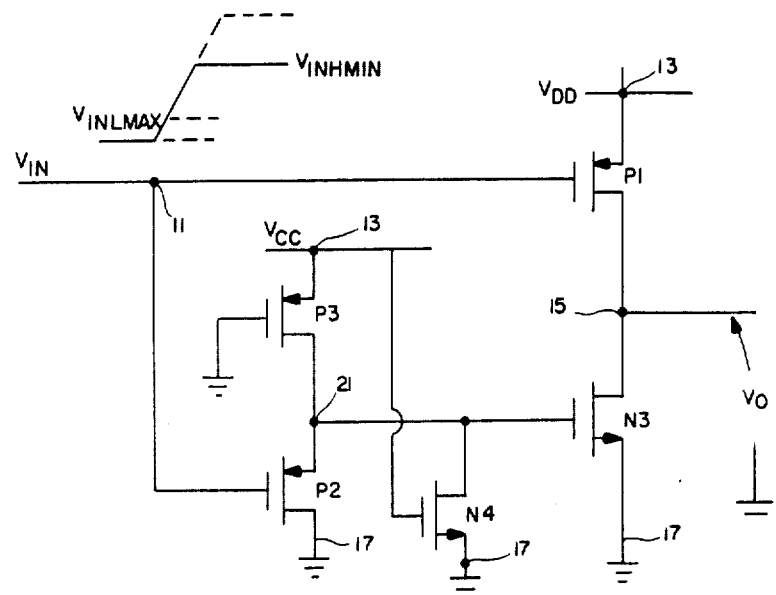
FIG. 3 is a schematic diagram of the equivalent circuit of FIG. 2 when operated as a level shifting buffer.

In the other mode (i.e. mode 1) the control signal (Vc) applied to terminal 19 is "low" (i.e. at, or close to, ground potential). This turns-off transistor N2, which disconnects N1 from the circuit, while P3 is turned-on. The circuit of FIG. 2 then functions as a TTL to CMOS level shifting buffer and may be redrawn as shown in FIG. 3. The output stage of the circuit is now comprised of "pull-up" IGFET P1 and "pull-down IGFET N3. IGFET P1, as shown in FIGS. 2 and 3, has its source-to-drain path connected between terminals 13 and 15 and its gate is connected to input terminal 11 to which is applied $V_{IN}$. Thus, the input signal $V_{IN}$ is directly applied to the gate of P1.

Assuming the control signal Vc in FIG. 2 to be at ground potential, IGFET P3 has its gate returned to ground, as shown in FIG. 3. IGFET P3, with its gate grounded, functions as a load impedance coupling power terminal 13 to node 21 via its source-to-drain path which functions as a resistance. IGFET P2, whose source-to-drain path is connected in series with the source-to-drain path of P3, is operated as a source follower. $V_{IN}$ is directly applied to the gate of P2 which buffers the input signal and does not load it. P2, in combination with P3, functions to level shift the signal ($V_{IN}$) applied to the gate electrode of P2 and to produce a signal ($V_{21}$) at the source (node 21) of P2 which is equal to $V_{IN}$ plus the $V_{GS}$ of P2. In the discussion to follow, it is assumed, for ease of explanation, that the gate-to-source voltage ($V_{GS}$) of P2 is equal to its threshold voltage, $V_{TP}$, although the $V_{GS}$ is, generally, slightly greater than $V_{TP}$. Hence, $V_{21}$ is assumed equal to $V_{IN}+V_{TP}$, where $V_{TP}$ is the threshold voltage of P2. IGFET N3 has its source-to-drain path connected between terminals 15 and 17 and its gate is connected to node 21. Hence, $V_{IN}+V_{TP}$ is applied to the gate of N3.

The operation of the circuit of FIG. 3 will now be detailed bearing in mind that FIG. 3 is a simplified equivalent version of the circuit of FIG. 2, when Vc is low. In the operation of the circuit of FIG. 3, the input signal $V_{IN}$ is directly applied to the gate electrodes of P1 and P2. As already noted, P3 functions as a load resistor coupling $V_{DD}$ to the source electrode of P2 which functions as a source follower. P2 then level shifts the input signal, $V_{IN}$, whereby a level shifted signal equal to $V_{IN}+V_{TP}$ is applied to the gate electrode of N3. The ON impedance of N4 (connected between node 21 and ground) is significantly greater than the ON impedance of P2 and/or P3, whereby when P3 is turned-on and P2 is conducting, the effect of N4 may be neglected. Therefore, when P3 is turned-on, the input signal $V_{IN}$ applied to the gate electrode of P2 is level shifted by the $V_{GS}$ of P2, which is assumed equal to $V_{TP}$, and the signal ($V_{21}$) produced at node 21 is then equal to $V_{IN}+V_{TP}$.

Applying $V_{IN}$ level shifted by $V_{TP}$ to the gate electrode of N3 ensures that, when $V_{IN}$ is equal to (or more positive than) $V_{INHMIN}$, pull-down IGFET N3 is turned-on harder than pull-up IGFET P1 whereby the output (Vo) of the circuit is driven below $V_{DD}/2$ even when the $V_T$ of N3 is at its maximum rated value. At the same time, the amount of level shifting is limited to ensure that, when $V_{IN}$ is equal to (or less than) $V_{INLMAX}$, P1 is turned-on harder than N3 whereby the output (Vo) of the circuit is driven above $V_{DD}/2$.

When $V_{IN}$ is equal to $V_{INHMIN}$, $V_{INHMIN}$ plus $V_{TP}$ is applied to the gate of N3 and $V_{INHMIN}$ is applied to the gate of P1. For these values of input signal, the voltage applied to the gate of N3 is sufficiently positive to cause N3 to be turned-on harder than P1 and, hence, to cause the voltage (Vo) at the output 15 of the buffer to be less positive than $V_{DD}/2$ volts. When $V_{IN}$ is equal to $V_{INLMAX}$, $V_{INLMAX}$ plus $V_{TP}$ is applied to the gate of N3 while $V_{INLMAX}$ is applied to the gate of P1. For these values of signal P1 is always turned-on harder than N3 and Vo is more positive than $V_{DD}/2$.

The "drive" potentials applied to P1 and N3 may be examined in greater detail to show that the circuit of FIG. 3 functions to produce: (1) a Vo which is more positive than $V_{DD}/2$ for values of $V_{IN}$ equal to, or less than, $V_{INLMAX}$; and (2) a Vo which is less positive than $V_{DD}/2$ for values of $V_{IN}$ equal to, or more than, $V_{INHMIN}$. The "drive" potential applied to P1 and N3 is defined herein as the applied gate-to-source potential ($V_{GS}$) minus the threshold voltage ($V_{TP}$ or $V_{TN}$) of the transistors.

The "drive" potentials for P1 and N3 and the voltage ($V_{21}$) at node 21 may be expressed as follows:

$$P1\ drive = V_{DD} - V_{IN} - TP \qquad \text{eq. 1}$$

$$V21 = _{IN} + V_{TP} \qquad \text{eq. 2}$$

$$N3 \text{ drive} = V_{IN} + V_{TP} - V_{TN} \qquad \text{eq. 3}$$

The operation of the circuit of FIG. 3 may be analyzed with the aid of equations 1, 2 and 3 for different values of $V_{TP}$ and $V_{TN}$ and for different values of operating voltage ($V_{DD}$). For ease of analysis, the following assumptions were made:

1. Due to noise degradation, the assumption is made that $V_{IN}$ is a binary valued input signal which has a $V_{INHMIN}$ equal to 2 volts when $V_{DD}$ is equal to 4.5 volts and a $V_{INHMIN}$ equal to 2.5 volts when $V_{DD}$ is equal to 5 volts or more. The "low" value of $V_{IN}$ ranges between 0 volts and 0.8 volt with $V_{INLMAX}$ being equal to 0.8 volt.

2. All the P-transistors are assumed to have the same threshold voltage ($V_{TP}$) and all the N-transistors are assumed to have the same threshold voltage ($V_{TN}$).

Some of the results of the analysis are tabulated in TABLES I and II below. TABLE I lists the "drive" potential developed across the gate-to-source of P1 and N3 for the condition of $V_{DD} = 4.5$ volts, $V_{INHMIN} = 2.0$ more positive than $V_{DD}/2$ when $V_{IN}$ is equal to, or less than, $V_{INLMAX}$.

Thus, in circuits embodying the invention, the threshold voltage of transistor N3 may be equal to, or even somewhat greater than, $V_{INHMIN}$, and the circuit will still respond properly when $V_{IN}$ is equal to $V_{INHMIN}$—Logic "Hi"—condition.

Figure 4:
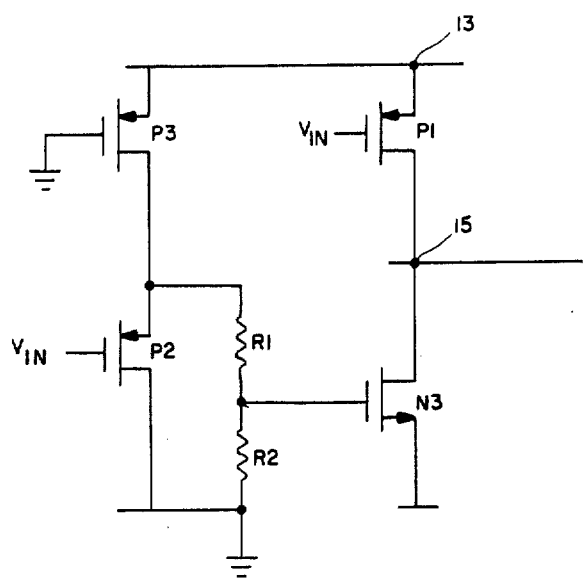
FIG. 4 is a schematic diagram of another circuit embodying the invention.

In the circuit of FIGS. 2 and 3, the signal was level shifted by a full threshold voltage, $V_{TP}$. FIG. 4 shows that a voltage dividing means comprised of two resistors R1 and R2 may be connected between the source 21 of P2 and ground to produce a fraction (i.e. R2/[R1+R2]) of $V_{TP}$. $V_{IN}$ is then level shifted by a fraction of $V_{TP}$ and the fractional level shifted signal is then applied to the gate electrode of transistor N3.

The invention has been illustrated for the condition where $V_{IN}$ was level shifted in the positive direction by applying $V_{IN}$ to the gate electrode of a P-type IGFET (P2) functioning as a source follower. It should be evident that the circuit of the invention may be suitably modified, where necessary, by applying $V_{IN}$ to the gate electrode of an N-type IGFET to level shift $V_{IN}$ in the negative direction.

TABLE I

|  | P1 drive [$V_{GS}$ of P1 $- V_{TP}$] | $V_{21} =$ $V_{IN} + V_{TP}$ | N3 Drive [$V_{GS}$ of N3 $- V_{TN}$] | Vo at terminal 15 |
|---|---|---|---|---|
| 1. $V_{TP} = 1.4$ V, $V_{TN} = 1.4$ V |  |  |  |  |
| $V_{IN} = V_{INHMIN}$ | 1.1 V | 3.9 V | 2.5 V | 1.3 V - "LO" |
| $V_{IN} = V_{INLMAX}$ | 2.8 V | 2.2 V | 0.8 V | 4.0 V - "HI" |
| 2. $V_{TP} = 2.0$ V, $V_{TN} = 1.4$ V |  |  |  |  |
| $V_{IN} = V_{INHMIN}$ | 0.5 V | 4.5 V | 3.1 V | 0.5 V - "LO" |
| $V_{IN} = V_{INLMAX}$ | 2.2 V | 2.8 V | 1.4 V | 3.0 V - "HI" |
| 3. $V_{TP} = 1.4$ V, $V_{TN} = 2.0$ V |  |  |  |  |
| $V_{IN} = V_{INHMIN}$ | 1.1 V | 3.9 V | 1.9 V | 1.8 V - "LO" |
| $V_{IN} = V_{INLMAX}$ | 2.8 V | 2.2 V | 0.2 V | 4.6 V - "HI" |
| 4. $V_{TP} = 2.0$ V, $V_{TN} = 2.0$ V |  |  |  |  |
| $V_{IN} = V_{INHMIN}$ | 0.5 V | 4.5 V | 2.5 V | 0.8 V - "LO" |
| $V_{IN} = V_{INLMAX}$ | 2.2 V | 2.8 V | 0.8 V | 3.8 V - "HI" |

Note:
$V_{DD} = 5$ volts; $V_{DD}/2 = 2.5$ volts; $V_{INHMIN} = 2.5$ volts; $V_{INLMAX} = 0.8$ volt

TABLE II

|  | P1 drive [$V_{GS}$ of P1 $- V_{TP}$] | $V_{21}$ | N3 Drive [$V_{GS}$ of N3 $- V_{TN}$] | Vo |
|---|---|---|---|---|
| 1. $V_{TP} = 1.4$ V, $V_{TN} = 1.4$ V |  |  |  |  |
| $V_{IN} = V_{INHMIN}$ | 1.1 V | 3.4 V | 2.0 V | 1.5 V - "LO" |
| $V_{IN} = V_{INLMAX}$ | 2.3 V | 2.2 V | 0.8 V | 3.5 V - "HI" |
| 2. $V_{TP} = 2.0$ V, $V_{TN} = 1.4$ V |  |  |  |  |
| $V_{IN} = V_{INHMIN}$ | 0.5 V | 4.0 V | 2.6 V | 0.8 V - "LO" |
| $V_{IN} = V_{INLMAX}$ | 1.7 V | 2.8 V | 1.4 V | 2.6 V - "HI" |
| 3. $V_{TP} = 1.4$ V, $V_{TN} = 2.0$ V |  |  |  |  |
| $V_{IN} = V_{INHMIN}$ | 1.1 V | 3.4 V | 1.4 V | 1.8 V - "LO" |
| $V_{IN} = V_{INLMAX}$ | 2.3 V | 2.2 V | 0.2 V | 4.2 V - "HI" |
| 4. $V_{TP} = 2.0$ V, $V_{TN} = 2.0$ V |  |  |  |  |
| $V_{IN} = V_{INHMIN}$ | 0.5 V | 4 V | 2.0 V | 0.9 V - "LO" |
| $V_{IN} = V_{INLMAX}$ | 1.7 V | 2.8 V | 0.8 V | 3.0 V - "HI" |

Note
$V_{DD} = 4.5$ V; $V_{DD}/2 = 2.25$ V;
$V_{INHMIN} = 2.0$ V; $V_{INLMAX} = 0.8$ V.

volts, $V_{INLMAX} = 0.8$ volt and for four different conditions of $V_{TP}$ and $V_{TN}$. TABLE II lists the "drive" potential developed across the gate-to-source of P1 and N3 for the condition of $V_{DD} = 5$ volts, $V_{INHMIN} = 2.5$ volts, $V_{INLMAX} = 0.8$ volt and for four different conditions of $V_{TP}$ and $V_{TN}$.

The results indicate that for a wide range of operating and threshold voltages, Vo is less than $V_{DD}/2$ when $V_{IN}$ is equal to, or greater than, $V_{INHMIN}$ and Vo is

What is claimed is:

1. The combination comprising:
   first and second power terminals for the application therebetween of an operating potential;
   an input terminal for the application thereto of binary valued signals having a minimum high value ($V_{INHMIN}$) and having a maximum low value ($V_{INLMAX}$); and an output terminal for producing thereat an output signal having one binary value in response to one value of the input signal and having the other binary value in response to another value of input signal;

first and second insulated-gate field-effect transistors (IGFETs), of first and second conductivity type, respectively; each IGFET having source and drain electrodes defining the ends of a conduction path and a control electrode for controlling the conductivity of its conduction path;

means connecting the conduction path of said first IGFET between said first power terminal and said output terminal;

means connecting the conduction path of said second IGFET between said output terminal and said second power terminal; said second IGFET having a threshold voltage which may have a wide range of values whereby when a voltage having a value of $V_{INHMIN}$ is applied between the gate and source of said second IGFET it may not be turned-on;

means connecting the gate electrode of said first IGFET to said input terminal, said first IGFET being turned-on for input signals having one binary value and tending to be turned-off for input signals having the other binary value; and level shift means connected between said input terminal and the gate electrode of said second IGFET responsive to the signal level at said input terminal, for level shifting the signal applied to said input terminal by an amount $V_A$, where $V_A + V_{INHMIN}$ exceeds the threshold voltage of said second IGFET, and for applying the value of $V_A$ plus the value of the signal applied to said input terminal to the gate electrode of said second IGFET whereby the turn-on of said second IGFET is ensured when said input signal applied to said input terminal has a value of $V_{INHMIN}$.

2. The combination as claimed in claim 1 wherein said level shift means includes: (a) a third IGFET of same conductivity type as said first IGFET, said third IGFET having its drain connected to said second power terminal, its source connected to the gate electrode of said second IGFET and its gate electrode connected to said input terminal; and (b) an impedance means connected between the gate electrode of said second IGFET and said first power terminal.

3. The combination as claimed in claim 1 wherein said level shift means includes third and fourth IGFETs of same conductivity type as said first IGFET, said third IGFET having its source-to-drain path connected between the gate electrode of said second IGFET and said second power terminal and its gate electrode connected to said input terminal; and said fourth IGFET having its source-to-drain path connected between said first power terminal and said gate electrode of said second IGFET; and means for applying a control signal to the gate electrode of said fourth IGFET for selectively turning it on or off.

4. The combination comprising:

first and second power terminals for the application therebetween of an operating potential;

an input terminal, an output terminal, and a control terminal;

first, second and third insulated-gate field-effect transistors (IGFETs) of one conductivity type; and fourth, fifth, and sixth IGFETs of second conductivity type, opposite to said first conductivity type; each IGFET having source and drain electrodes defining the ends of a conduction path and a control electrode for controlling the conductivity of its conduction path;

means connecting the conduction path of said first IGFET between said first power terminal and said output terminal;

means connecting the conduction paths of said fourth and fifth IGFETs in series between said output terminal and said second power terminal;

means connecting the control electrodes of said first, second and fourth IGFETs to said input terminal;

means connecting the conduction path of said third IGFET between said first power terminal and the control electrode of said sixth IGFET;

means connecting the source-to-drain path of said second IGFET between the control electrode of said sixth IGFET and said second power terminal;

means connecting the control electrodes of said third and fifth IGFETs to said control terminal; and means connecting the conduction path of said sixth IGFET between said output terminal and said second power terminal.

5. The combination as claimed in claim 4 further including means for applying a dual mode control signal to said control terminal for, in one mode, turning-on said fifth IGFET and turning-off said third IGFET, the turn-on of said fifth IGFET for enabling said first and fourth IGFETs to function as a complementary inverter and the turn-off of said third IGFET for disabling said sixth IGFET; and for, in the other mode, turning-on said third IGFET and turning-off said fifth IGFET for producing a buffer circuit including said first IGFET and a level shift circuit comprising said second and third IGFETs functioning to produce a level shifted signal applied to the gate electrode of said sixth IGFET.

6. A level shift circuit comprising:

first and second power terminals for the application therebetween of an operating potential and the potential midway between the voltage at the two power terminals being equal to V/2;

first, second and third insulated-gate field-effect transistors (IGFETs), said first and third IGFETs being of first conductivity type and said second IGFET being of second conductivity type; each IGFET having source and drain electrodes defining the ends of a conduction path and a gate electrode for controlling the conductivity of its IGFET;

an input terminal for the application thereto of binary valued input signals;

an output terminal for producing thereat a signal ranging in value between V/2 and the potential at said first power terminal when the input signal has one binary value and a signal ranging in value between V/2 and the potential at said second power terminal when the input signal has the other binary value;

means connecting the conduction path of said first IGFET between said first power terminal and said output terminal;

means connecting the conduction path of said second IGFET between said output terminal and said second power terminal;

means connecting said input terminal to the gate electrode of said first IGFET;

means connecting the drain electrode of said third IGFET to said second power terminal;

an impedance means connected at one end to said first power terminal and at its other end to the source of said third IGFET and to the gate electrode of said second IGFET; and means connecting said input terminal to the gate electrode of said third IGFET for causing the signal produced at the source electrode of said third IGFET and the gate electrode of said second IGFET to be equal to the voltage of the input signal plus the gate-to-source voltage of said third IGFET.

7. The combination as claimed in claim 2 wherein said third IGFET is connected to conduct in the source follower mode.

8. The combination as claimed in claim 4 wherein said second IGFET is connected to conduct in the source follower mode.

9. The combination as claimed in claim 6 wherein said third IGFET is interconnected to conduct in the source follower mode.

* * * * *

UNITED STATES PATENT AND TRADEMARK OFFICE
CERTIFICATE OF CORRECTION

PATENT NO. : 4,707,623

DATED : Nov. 17, 1987

INVENTOR(S) : Otto H. Bismarck

It is certified that error appears in the above-identified patent and that said Letters Patent is hereby corrected as shown below:

Col. 1, line 20, delete "18" and insert --1B--.

Col. 2, line 68, after "N3" insert --and N4 are returned to ground potential. The drain of N3--.

Col. 4, line 67 (eq. 1) remove "TP" and insert --$V_{TP}$--.

Col. 5, line 1 (eq. 2) remove "IN" and insert --$V_{IN}$--.

Signed and Sealed this

Twenty-eighth Day of June, 1988

Attest:

DONALD J. QUIGG

Attesting Officer

Commissioner of Patents and Trademarks